United States Patent
Hart

(10) Patent No.: US 7,296,247 B1
(45) Date of Patent: Nov. 13, 2007

(54) METHOD AND APPARATUS TO IMPROVE PASS TRANSISTOR PERFORMANCE

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 191 days.

(21) Appl. No.: 10/919,758

(22) Filed: Aug. 17, 2004

(51) Int. Cl.
*G06F 17/50* (2006.01)

(52) U.S. Cl. ............................................. 716/2; 716/4

(58) Field of Classification Search ................... 716/2, 716/4
See application file for complete search history.

(56) References Cited

U.S. PATENT DOCUMENTS

| | | | | |
|---|---|---|---|---|
| 3,899,693 | A * | 8/1975 | Gaudreault | 327/513 |
| 4,207,538 | A * | 6/1980 | Goel | 330/277 |
| 5,406,144 | A * | 4/1995 | Houston | 327/513 |
| 5,822,241 | A * | 10/1998 | Chatterjee et al. | 365/149 |
| 6,091,286 | A * | 7/2000 | Blauschild | 327/543 |
| 6,377,113 | B1 * | 4/2002 | Kanno | 327/543 |
| 6,535,034 | B1 * | 3/2003 | Wong | 327/108 |
| 6,671,152 | B1 * | 12/2003 | Hersel et al. | 361/93.8 |
| 6,905,928 | B2 * | 6/2005 | Kanda et al. | 438/260 |
| 6,933,869 | B1 * | 8/2005 | Starr et al. | 341/120 |
| 6,960,926 | B2 * | 11/2005 | Anderson et al. | 324/766 |
| 2004/0128631 | A1 * | 7/2004 | Ditzel et al. | 716/2 |
| 2005/0138581 | A1 * | 6/2005 | Usui | 716/4 |
| 2005/0204319 | A1 * | 9/2005 | Hanafi et al. | 716/4 |

OTHER PUBLICATIONS

Shakeri, K, et al., "Temperature variable supply voltage for power reduction", Apr. 2002, IEEE Computer Society Annual Symposium on VLSI, pp. 64-67.*

* cited by examiner

*Primary Examiner*—Stacy A Whitmore
(74) *Attorney, Agent, or Firm*—William L. Paradice, III

(57) ABSTRACT

A control circuit generates a temperature-dependent gate voltage for turning on a transistor. For NMOS transistors, the gate voltage is increased in response to decreases in temperature to compensate for corresponding increases in the transistor's threshold voltage, and is decreased in response to increases in temperature to compensate for corresponding increases in the transistor's gate oxide's susceptibility to breakdown. For PMOS transistors, the gate voltage is decreased in response to decreases in temperature, and is increased in response to increases in temperature. For some embodiments, the gate voltage is adjusted according to a predetermined relationship between gate voltage and temperature.

20 Claims, 4 Drawing Sheets

METHOD AND APPARATUS TO IMPROVE PASS TRANSISTOR PERFORMANCE

FIELD OF INVENTION

The present invention relates generally to integrated circuits, and more specifically to improving performance of pass transistors at low temperatures.

DESCRIPTION OF RELATED ART

As integrated circuit (IC) designs become more complex and include greater numbers of transistors, IC developers are moving to smaller process geometries to conserve valuable silicon area. Because smaller transistors typically employ thinner gate oxide layers that are increasingly more susceptible to voltage breakdown, smaller process geometries typically use smaller supply voltages to increase gate oxide lifetime. Accordingly, as supply voltages continue to decrease, so do the gate voltages used to turn on NMOS pass transistors.

FIG. 1 shows an exemplary system 100 in which an NMOS pass transistor 120 coupled between a first logic element 110a and a second logic element 110b has a gate to receive a gate voltage Vg. Referring also to FIG. 2, transistor 120 includes an n+ type source region 121 and an n+ type drain region 122 formed in a suitable p− type substrate 123 with a channel region 124 extending between source 121 and drain 122. A gate 125 formed of a suitable material such as polysilicon is insulated from substrate 123 by a layer of gate oxide 126. When the voltage applied between gate 125 and source 121 (Vgs) exceeds the threshold voltage (VT) of transistor 120, transistor 120 turns on and can pass signals between logic elements 110a and 110b. Conversely, when Vgs is less than VT, transistor 120 is non-conductive and does not pass signals between logic elements 110a and 110b.

The VT of transistor 120 is inversely related to temperature. Thus, transistor 120's VT increases in response to temperature decreases. Further, because the lifetime of gate oxide 126 is inversely related to the voltage differential across gate oxide 126, the value of Vg for turning on transistor 120, which is sometimes referred to as the transistor's on-state gate voltage, is typically maintained at some predetermined level that results in a desired gate oxide lifetime. Accordingly, as temperature decreases, corresponding increases in VT cause the on-state gate voltage Vg applied to transistor 120 to become increasingly less effective for turning on transistor 120, thereby resulting in a degradation in transistor 120's performance at lower temperatures.

Thus, there is a need to improve transistor performance at low temperatures without sacrificing its gate oxide lifetime.

SUMMARY

A method and apparatus are disclosed that improve the performance of a transistor by adjusting the transistor's on-state gate voltage in response to temperature variations. In accordance with some embodiments of the present invention, the transistor on-state gate voltage is increased at lower temperatures and is decreased at higher temperatures. Increasing the transistor on-state gate voltage in response to decreasing temperatures compensates for corresponding increases in the transistor's threshold voltage, thereby improving transistor performance at relatively low temperatures. Conversely, decreasing the on-state gate voltage in response to increasing temperatures reduces the gate oxide's susceptibility to voltage breakdown, thereby avoiding undesirable reductions in the gate oxide's lifetime at relatively high temperatures.

Generating a temperature-dependent on-state gate voltage that improves transistor performance at low temperatures without degrading gate oxide lifetime at high temperatures is in marked contrast to conventional circuit techniques that maintain the transistor on-state gate voltage at a constant value.

For some embodiments, a gate voltage control circuit having a power terminal coupled to a supply voltage and having an output coupled to the transistor's gate is configured to adjust the transistor on-state gate voltage in response to temperature variations according to a predetermined relationship between gate voltage and temperature. For other embodiments, a look-up table embodying the desired relationship between gate voltage and temperature may be used to facilitate adjustments in the gate voltage according to operating temperature.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of improving the performance of an exemplary NMOS transistor for simplicity only. It is to be understood that present embodiments are equally applicable for improving the performance of PMOS transistors. Further, although not shown in the figures for simplicity, embodiments of the present invention may also be used to improve the performance of other transistor architectures, for example, floating gate transistor devices commonly used to form non-volatile memory devices such as EPROM cells, EEPROM cells, flash memory cells, and the like. In the following description, for purposes of explanation, specific nomenclature is set forth to provide a thorough understanding of the present invention. For example, as used herein, the term "gate voltage" refers to a transistor's on-state gate voltage, e.g., the gate voltage required to create a transistor gate-to-source voltage differential that sufficiently exceeds the transistor's threshold voltage to turn on the transistor. In other instances, well-known circuits and devices are shown in block diagram form to avoid obscuring the present invention unnecessarily. Accordingly, the present invention is not to be construed as limited to specific examples described herein but rather includes within its scope all embodiments defined by the appended claims.

Figure 1:
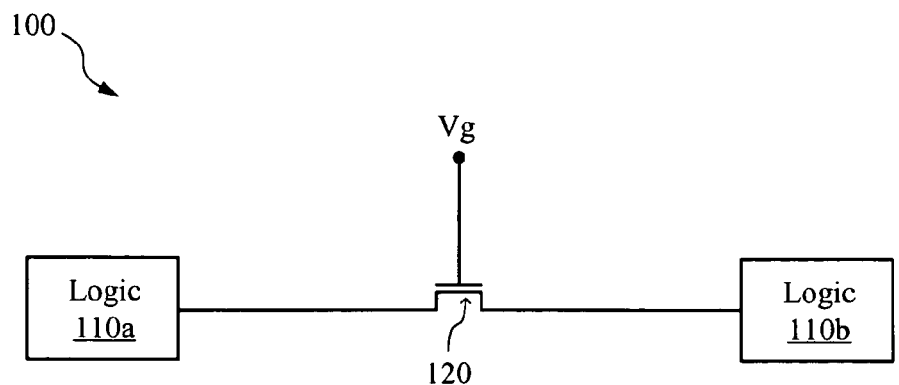
FIG. 1 is a block diagram of a system including a conventionally controlled NMOS pass transistor coupled between two logic elements.
Figure 2:
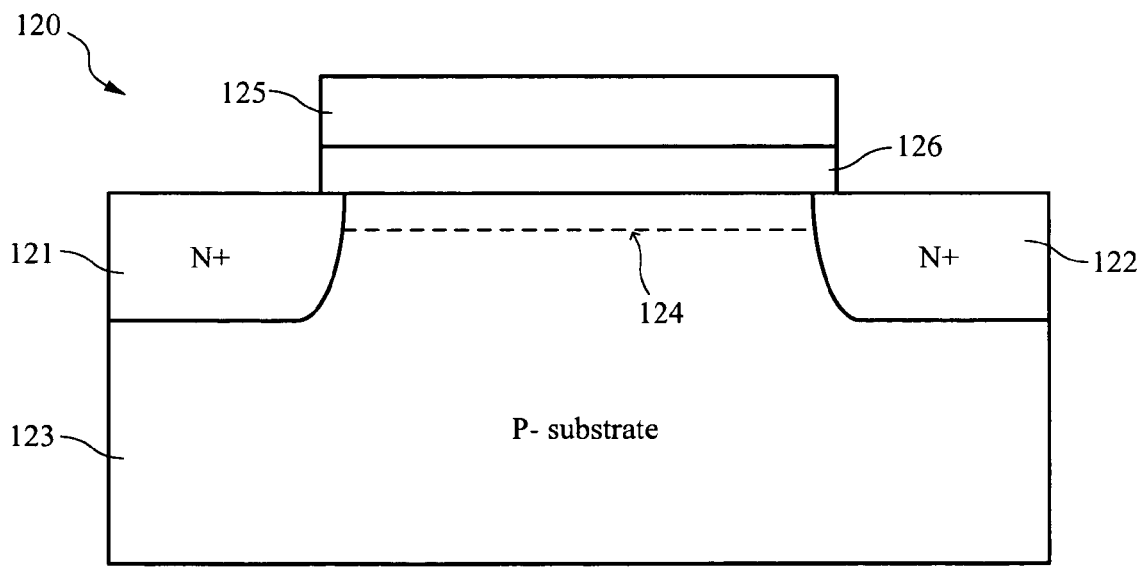
FIG. 2 is an illustrative cross-sectional diagram of the transistor of FIG. 1.
Figure 3:
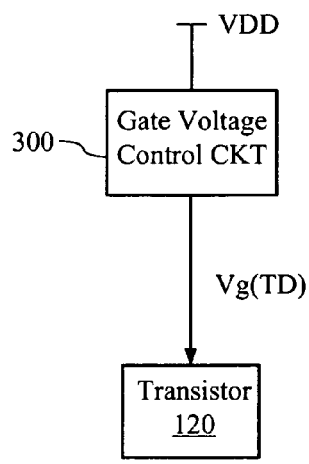
FIG. 3 is a block diagram showing a transistor controlled by a temperature-dependent gate voltage generated by a gate voltage control circuit in accordance with one embodiment of the present invention.

FIG. 3 shows a gate voltage control circuit 300 having a power terminal coupled to a supply voltage VDD and having an output coupled to the gate (not shown in FIG. 3 for simplicity) of NMOS transistor 120. In accordance with the present invention, gate voltage control circuit 300 is configured to generate a temperature-dependent gate voltage Vg(TD) for turning on transistor 120. More specifically, gate voltage control circuit 300 adjusts the magnitude of Vg(TD) in response to variations in operating temperature to improve the performance of transistor 120 at relatively low temperatures without reducing its gate oxide lifetime at relatively high temperatures. As described in more detail below, when the operating temperature decreases, control circuit 300 increases Vg(TD) to compensate for corresponding increases in the VT of transistor 120, and conversely, when the operating temperature increases, control circuit 300 decreases Vg(TD) to reduce the susceptibility of transistor 120's gate oxide to voltage breakdown.

For simplicity, transistor 120 is not shown in FIG. 3 as being coupled to any logic elements, circuits, or devices. However, for some embodiments, transistor 120 may be used as a pass transistor for routing signals between any suitable logic elements, circuits, signal lines, and/or devices. For one embodiment, transistor 120 may be a pass transistor in a programmable logic device (PLD). For other embodiments, transistor 120 may be used for functions other than a pass transistor such as, for example, to form logic circuits (e.g., NAND, NOR, XOR, and inverter gates), pull-up and pull-down circuits, storage elements (e.g., SRAM and CAM cells), and other well-known circuits.

Figure 4:
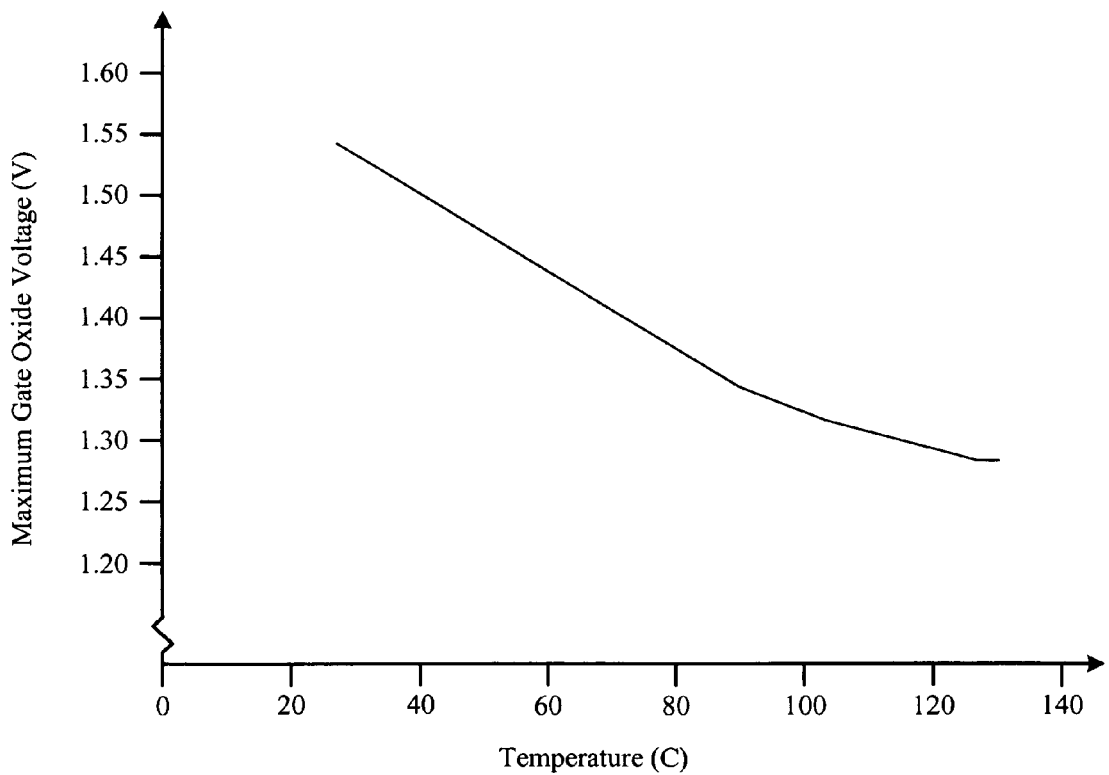
FIG. 4 is an exemplary plot generally representative of the relationship between a maximum voltage differential tolerable by the gate oxide and temperature.
Figure 5:
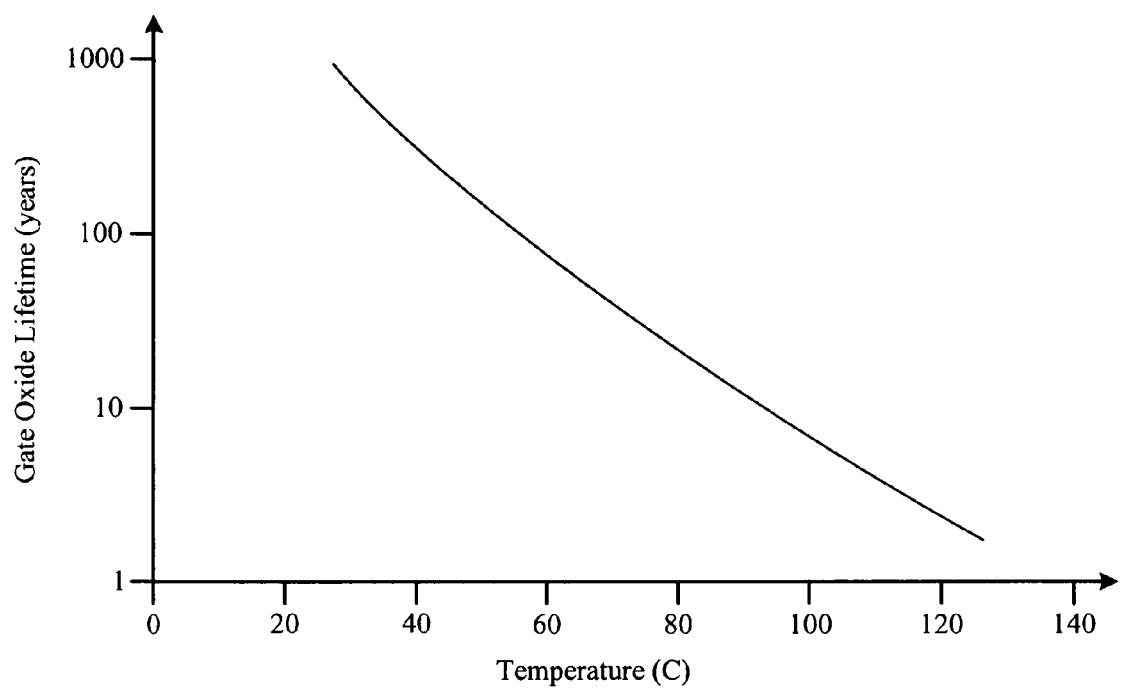
FIG. 5 is an exemplary plot generally representative of the relationship between gate oxide lifetime and temperature.

As mentioned above, because a transistor's gate oxide is more susceptible to breakdown at higher voltages than at lower voltages, prior circuit techniques typically maintain the transistor gate voltage at some predetermined level to achieve a desired gate oxide lifetime at a specified maximum operating temperature. However, although more susceptible to breakdown at higher voltages than at lower voltages, the gate oxide is typically less susceptible to voltage breakdown at lower temperatures than at higher temperatures. For example, as illustrated in the exemplary plot of FIG. 4, the maximum voltage differential tolerable by a transistor's gate oxide is much greater at lower temperatures than at higher temperatures. As a result, gate oxide lifetime may be significantly greater at lower temperatures than at higher temperatures, as illustrated in the exemplary plot of FIG. 5. Indeed, as depicted in the plot of FIG. 5, gate oxide lifetime may, for example, be several orders of magnitude greater at 25° C. than at 125° C.

Thus, because a transistor's gate oxide lifetime is much greater at lower temperatures than at higher temperatures, which indicates that the gate oxide's susceptibility to voltage breakdown is less at lower temperatures than at higher temperatures, the application of greater voltages across the gate oxide at lower temperatures may not decrease the gate oxide's lifetime. Accordingly, decreases in gate oxide lifetime at higher voltages may be offset by corresponding increases in gate oxide lifetime at lower temperatures, thereby allowing embodiments of the present invention to increase transistor gate voltages at lower temperatures to improve transistor performance without sacrificing gate oxide lifetime. Further, because the transistor threshold voltage decreases at higher temperatures, present embodiments may decrease the gate voltage at higher temperatures to offset the gate oxide's increased susceptibility to breakdown at higher voltages without degrading transistor performance.

Figure 6:
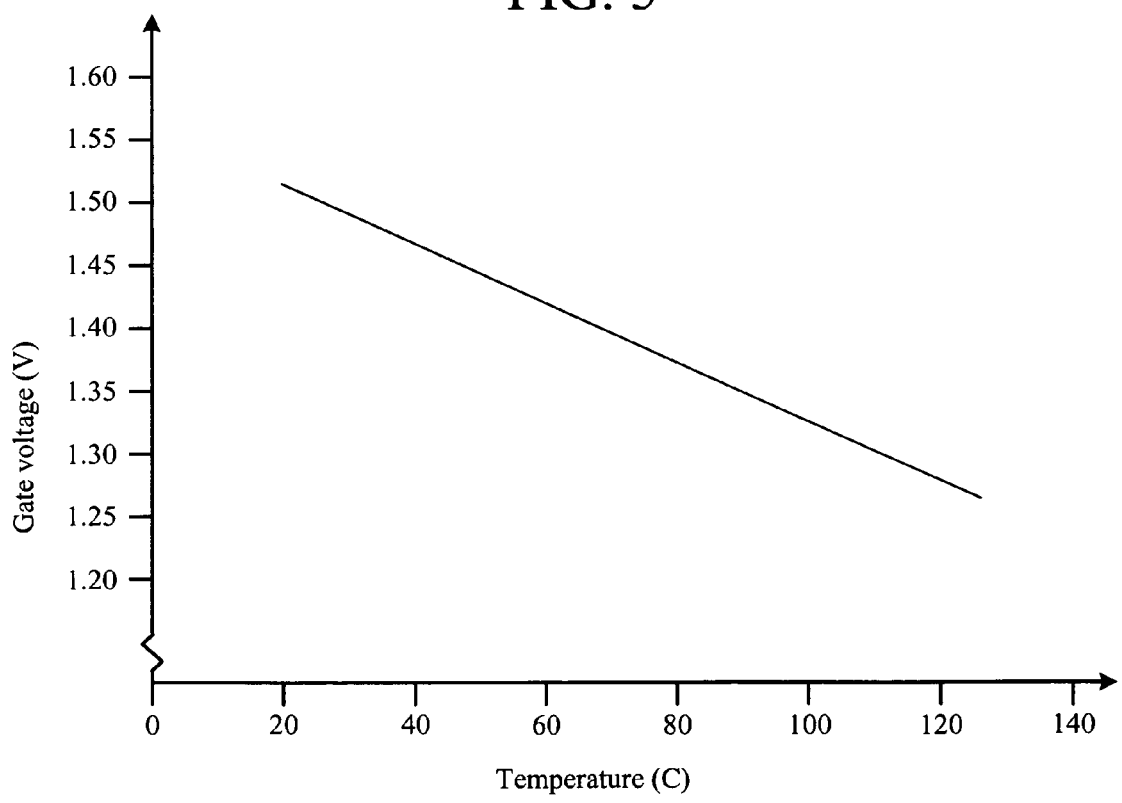
FIG. 6 is an exemplary plot illustrating a predetermined relationship between transistor gate voltage and temperature for one embodiment of the present invention.
Figure 7:
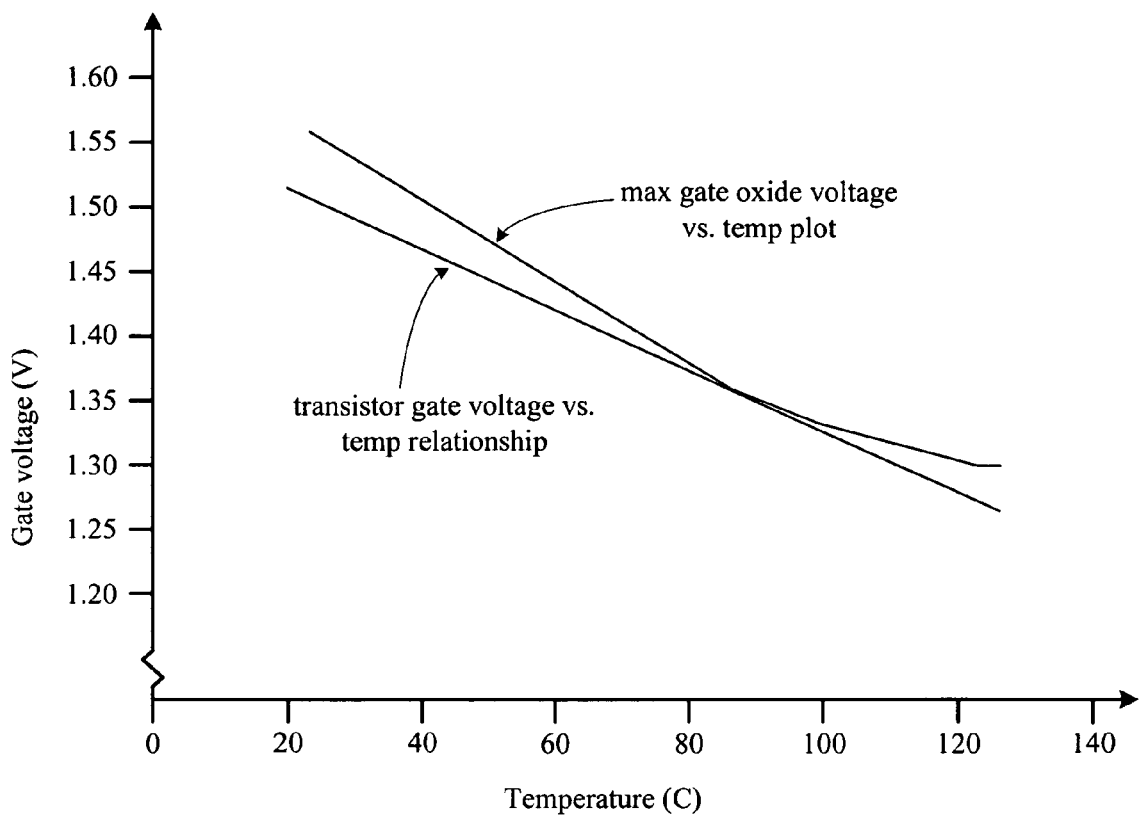
FIG. 7 is a graphical comparison between the gate voltage versus temperature plot of FIG. 6 with the maximum gate oxide voltage versus temperature plot of FIG. 4.

As mentioned above, gate voltage control circuit 300 generates a temperature-dependent gate voltage Vg(TD) for turning on transistor 120. For some embodiments, gate voltage control circuit 300 generates Vg(TD) according to a predetermined relationship between gate voltage and temperature, for example, as illustrated by the exemplary plot in FIG. 6. For purposes of discussion herein, FIG. 6 depicts a linear relationship between gate voltage and temperature. However, for other embodiments, the gate voltage versus temperature relationship employed by gate voltage control circuit 300 may have other slopes and/or may be of a non-linear nature. Referring again to FIG. 6, the exemplary linear relationship between gate voltage and temperature has a slope $dV/dT \approx 24$ mV/° C., which is generally consistent with the relationship between the maximum voltage differential tolerable by the gate oxide and temperature depicted in the exemplary plot of FIG. 4. For example, FIG. 7 is a graph illustrative of a comparison between the predetermined gate voltage versus temperature plot of FIG. 6 and the exemplary gate oxide voltage versus temperature plot of FIG. 4. However, it is to be noted that the predetermined gate voltage versus temperature relationship employed by gate voltage control circuit 300 may be derived from other relationships between the maximum gate oxide voltage differential and temperature, as may be required by the particular physical and operating characteristics of a transistor to be controlled by gate voltage control circuit 300.

Thus, as described above, for some embodiments, the predetermined gate voltage versus temperature relationship employed by gate voltage control circuit 300 to generate Vg (TD) may be derived from the relationship between the maximum gate oxide voltage differential and temperature. For other embodiments, the predetermined relationship between gate voltage and temperature employed by gate voltage control circuit 300 to generate Vg (TD) may be derived from other sources indicative of various temperature-dependent operating characteristics of transistor 120 such as, for example, from a relationship between transistor threshold voltage and temperature.

Gate voltage control circuit 300 may generate Vg (TD) according to a predetermined relationship between gate voltage and temperature using various well-known circuit techniques. For some embodiments, gate voltage control circuit 300 may employ a well-known bandgap reference circuit (not shown for simplicity) configured to have a desired negative temperature coefficient (e.g., −dV/dT) to adjust Vg(TD) with temperature in a manner consistent with a desired relationship between gate voltage and temperature. Bandgap reference circuits capable of generating an output voltage that varies inversely with temperature according to a desired voltage versus temperature relationship are well-known, and therefore are not described herein.

For other embodiments, gate voltage control circuit 300 may employ a well-known temperature transducer that may generate a temperature-dependent output voltage according to a desired gate voltage versus temperature relationship.

Figure 8:
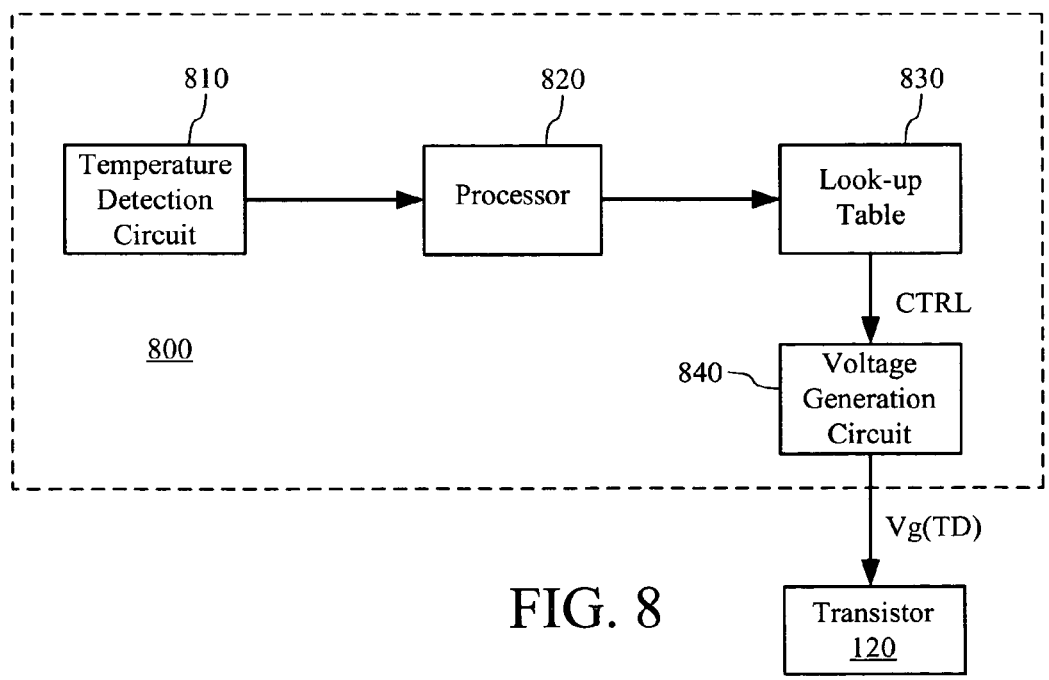
FIG. 8 is a block diagram of another embodiment of the gate voltage control circuit of FIG. 3.

FIG. 8 shows a gate voltage control circuit 800 that is another embodiment of gate voltage control circuit 300 of FIG. 3. Gate voltage control circuit 800 includes a temperature measuring circuit 810, a processor 820, a look-up table 830, and a voltage generation circuit 840. The desired predetermined relationship between gate voltage and temperature is embodied in look-up table 830, which may be any suitable storage element including, for example, a content addressable memory (CAM) device. Temperature measuring circuit 810, which may be any well-known device for measuring temperature, measures and then provides the temperature as an input to look-up table 830 via processor 820, which may be any suitable processor. For other embodiments, processor 820 may be eliminated. In response to the temperature measured by temperature measuring circuit 810, look-up table 830 outputs a control signal CTRL indicative of a particular gate voltage corresponding to the measured temperature. In response to CTRL, voltage generation circuit 840, which may be any well-known circuit that generates an output voltage adjustable in response to an input signal such as CTRL, generates Vg(TD) for transistor 120.

For other embodiments, the supply voltage of a semiconductor device may be adjusted according to the predetermined relationship between gate voltage and temperature (e.g., as embodied by the exemplary plot of FIG. 6) to improve transistor performance at lower temperatures without sacrificing gate oxide lifetime at higher temperatures. For example, gate voltage control circuit 300 may be connected to a device's supply voltage to increase the supply voltage in response to temperature decreases and to decrease the supply voltage in response to temperature increases.

Further, as mentioned above, embodiments of the present invention may also be used to improve the performance of PMOS transistors. For such embodiments, the polarity of the predetermined relationship between gate voltage and temperature employed by present embodiments is opposite of that described above with respect to NMOS transistor 120 and depicted in FIG. 6. For example, because the gate of a PMOS transistor is typically tied to ground potential to turn on the PMOS transistor and is tied to the supply voltage to turn off the PMOS transistor, embodiments of gate voltage control circuit 300 that provide a temperature-dependent gate voltage to the PMOS transistor may adjust the gate voltage in response to temperature variations using a predetermined gate voltage versus temperature plot having a negative slope, e.g., where $dV/dT \approx -24$ mV/° C. In this manner, gate voltage control circuit 300 decreases the gate voltage (e.g., toward ground potential) at relatively low temperatures to improve transistor performance and increases the gate voltage (e.g., toward some positive voltage) at relatively high temperatures to reduce the gate oxide's susceptibility to breakdown.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A method of improving performance of a transistor, the method comprising:
   generating a temperature-dependent gate voltage for turning on the transistor; and
   providing the temperature-dependent gate voltage to the transistor,
   wherein the gate voltage is adjusted according to a predetermined relationship between the gate voltage and temperature, and
   wherein the predetermined relationship between the gate voltage and temperature is derived from a relationship between a maximum voltage tolerable by a gate oxide layer in the transistor and temperature.

2. The method of claim 1, wherein the transistor comprises an NMOS transistor, and the gate voltage is inversely related to temperature.

3. The method of claim 1, wherein the transistor comprises a PMOS transistor, and the gate voltage is related to temperature.

4. A method of improving performance of a transistor, the method comprising:
   generating a temperature-dependent gate voltage for turning on the transistor; and
   providing the temperature-dependent gate voltage to the transistor,
   wherein the gate voltage is adjusted according to a predetermined relationship between the gate voltage and temperature, and
   wherein the predetermined relationship between the gate voltage and temperature is derived from a relationship between a threshold voltage of the transistor and temperature.

5. The method of claim 4, wherein the transistor comprises an NMOS transistor, and the gate voltage is inversely related to temperature.

6. The method of claim 4, wherein the transistor comprises a PMOS transistor, and the gate voltage is related to temperature.

7. A method of improving performance of a transistor, the method comprising:
   generating a temperature-dependent gate voltage for turning on the transistor;
   providing the temperature-dependent gate voltage to the transistor,
   wherein the gate voltage is adjusted according to a predetermined relationship between the gate voltage and temperature, and
   storing the predetermined relationship between the gate voltage and temperature in a storage element;
   wherein the transistor comprises an NMOS transistor, and the gate voltage is inversely related to temperature.

8. A system for improving transistor performance comprising:
   a transistor having a layer of gate oxide and characterized by a threshold voltage; and
   a control circuit having an input coupled to a supply voltage and having an output to generate a gate voltage for turning on the transistor, the control circuit configured to adjust the gate voltage according to a predetermined relationship between the gate voltage and temperature,
   wherein the predetermined relationship between the gate voltage and temperature is derived from a relationship between a maximum gate oxide voltage and temperature.

9. The system of claim 8, wherein the transistor comprises an NMOS transistor, and the control circuit increases the gate voltage in response to temperature decreases and increases the gate voltage in response to temperature increases.

10. The system of claim 8, wherein the transistor comprises a PMOS transistor, and the control circuit decreases the gate voltage in response to temperature decreases and increases the gate voltage in response to temperature increases.

11. The system of claim 8, wherein the transistor comprises a pass transistor in a programmable logic device.

12. A system for improving transistor performance comprising:
   a transistor having a layer of gate oxide and characterized by a threshold voltage; and
   a control circuit having an input coupled to a supply voltage and having an output to generate a gate voltage for turning on the transistor, the control circuit configured to adjust the gate voltage according to a predetermined relationship between the gate voltage and temperature,
   wherein the predetermined relationship between the gate voltage and temperature is derived from a relationship between the threshold voltage and temperature.

13. The system of claim 12, wherein the transistor comprises an NMOS transistor, and the control circuit increases the gate voltage in response to temperature decreases and increases the gate voltage in response to temperature increases.

14. The system of claim 12, wherein the transistor comprises a PMOS transistor, and the control circuit decreases the gate voltage in response to temperature decreases and increases the gate voltage in response to temperature increases.

15. The system of claim 12, wherein the transistor comprises a pass transistor in a programmable logic device.

16. A system for improving transistor performance comprising:
   a transistor having a layer of gate oxide and characterized by a threshold voltage; and
   a control circuit having an input coupled to a supply voltage and having an output to generate a gate voltage for turning on the transistor, the control circuit configured to adjust the gate voltage according to a predetermined relationship between the gate voltage and temperature,
   wherein the control circuit further comprises:
   a storage element to store information embodying the predetermined relationship between the gate voltage and temperature; and
   wherein the transistor comprises a PMOS transistor, and the control circuit decreases the gate voltage in response to temperature decreases and increases the date voltage in response to temperature increases.

17. The system of claim 16, wherein the control circuit further comprises:
   a circuit having an input to determine temperature and having an output coupled to the storage element.

18. The system of claim 16, wherein the transistor comprises a pass transistor in a programmable logic device.

19. A system for improving performance of a transistor having a layer of gate oxide and characterized by a threshold voltage, comprising:
   means for providing a gate voltage for turning on the transistor;
   means for adjusting the gate voltage in response to a predetermined relationship between the gate voltage and temperature; and
   means for storing the predetermined relationship between the gate voltage and temperature;
   wherein the predetermined relationship between the gate voltage and temperature is derived from at least one of a relationship between a maximum gate oxide voltage and temperature and a relationship between the threshold voltage and temperature.

20. The system of claim 19, further comprising:
   means for determining the temperature.

* * * * *